United States Patent [19]
Alexander

[11] Patent Number: 5,953,684
[45] Date of Patent: Sep. 14, 1999

[54] METHODS AND APPARATUS FOR INTEGRATED STORAGE OF TEST ENVIRONMENT CONTEXT INFORMATION

[75] Inventor: Jay A. Alexander, Monument, Colo.

[73] Assignee: Hewlett-Packard Company, Palo Alto, Calif.

[21] Appl. No.: 08/821,972

[22] Filed: Mar. 17, 1997

[51] Int. Cl.[6] .................................................... G06F 11/27
[52] U.S. Cl. ............................ 702/108; 714/30; 714/734
[58] Field of Search ................. 702/108; 371/22.1–22.5; 714/30, 724–726, 733, 734, 738

[56] References Cited

U.S. PATENT DOCUMENTS

| | | | |
|---|---|---|---|
| 5,751,735 | 5/1998 | Tobin et al. | 371/22.5 |
| 5,771,240 | 6/1998 | Tobin et al. | 371/22.1 |

*Primary Examiner*—Kamini Shah

[57] ABSTRACT

Methods and structure for storing context data regarding electronic test equipment and the device under test or stimulus sources in a manner integrated with the capture and storage of test data as well as test setup data associated with a test environment. The context data may include information regarding parameters of the test environment (e.g., test equipment or test bench set points and configurations, configuration information regarding the device under test, etc.). The context data may be provided in the form of standard textual data as well as user voice sequences to be recorded. The context data is associated with any stored test data or test setup data so as to be easily retrieved along with the retrieval of the associated data. The data are associated by any of several methods including file naming conventions, structured files, table lookups, etc. Use of present invention therefore avoids many problems inherent in prior manual processes in which context data may be lost, incorrectly recalled, or disassociated with the corresponding test data and test setup data.

21 Claims, 5 Drawing Sheets

METHODS AND APPARATUS FOR INTEGRATED STORAGE OF TEST ENVIRONMENT CONTEXT INFORMATION

BACKGROUND OF THE INVENTION

1. Field of the Invention

The invention relates to electronic test equipment and a system for storing electronic test related information and, in particular, to an apparatus and method for storing test context data in a manner integrated with other test related data including instrument setup data and captured test data.

2. Description of Related Art

Conventional electronic test equipment, such as oscilloscopes, logic analyzers, etc., generally allow users to save data acquired from the device under test (also referred to herein as "test data" or "acquired data") and several control or configuration settings of the test equipment (also referred to herein as "test setup" or "setup data" or "test setup data"). The test equipment is configured to acquire data from a device under test (also referred to herein as a "test device"). The test device may be incorporated into a larger test bench which may include, for example, devices used to generate stimuli.

The test data and setup data may be stored in storage means within the test equipment used to acquire the test data or may be stored in a general purpose computer connected to the test equipment and used to provide a richer user interface in control of the test equipment. The saved information is later recalled by the scientist or engineer to recreate a prior test, for documentation, or for data reduction purposes.

A problem encountered by the test equipment user is the inability of the conventional test equipment to capture and store the specifics of the measurement environment (also referred to herein as "context data", "background data", "background information", or "context information"). The test equipment user therefore has little background or context information for the originally saved test data and test setup. Exemplary background information or context data may include, for example, the points (leads) probed on the device under test, identification information for the device under test (e.g., board number or revision information), the ambient temperature, stimuli generating device settings (e.g., a power supply voltage), other parameters of the test bench, etc.

Often this background information is stored manually and separately (such as in a lab notebook) and must be correctly correlated at a later time with the saved information regarding the test setup. Errors in manually correlating the test setup and the background information make it difficult to duplicate earlier test conditions, to form a baseline for test data, to create documents for design reviews, or to reduce and analyze test data for device failure reviews.

Manually gathered and stored context data is subject to a number of human errors. As the test environment changes, recordation of such changes in the background information may be lost or forgotten. Or, for example, a number of tests may be performed in rapid succession to isolate a particular problem. Successive tests might, for example, modify a single stimuli over a range of values. With each successive test, the context information may require updating which may be lost if manual procedures are relied upon.

It is evident from the above discussion that a need exists for improved methods and apparatus for generating and storing context data associated with test data and setup data of a particular test environment.

SUMMARY OF THE INVENTION

The present invention solves the above and other problems, thereby advancing the state of the useful arts, by providing a system to store context data in a manner which is integrated with test setup data and test data. More specifically, the present invention provides for storage of background data (context data) in storage means and provides for structure which associates the stored context data with corresponding test data and test setup data. The context data may be stored in the same storage means as the test data and test setup or stored in a manner that is linked or otherwise associated with the corresponding test data and setup data. The storage means (also referred to herein as a memory) may include, for example, files on a mass storage device (e.g., a hard disk or floppy disk medium) as well as storage in other non-volatile storage devices (e.g., programmable semiconductor memory devices).

The storage means may be embodied within a general purpose computer system connected to the test equipment or may be integrated within the test equipment. In either case, the present invention utilizes user interface means to enter or update the context data as the test environment changes. A general purpose computer system often possesses superior user interface capabilities as compared to test equipment. For example, a general purpose computer system may include a windowed user interface such that a window may "pop-up" prompting the user to enter/modify the context data when necessary. However, many current test equipment devices (e.g., oscilloscopes and logic analyzers) have highly sophisticated user interaction capabilities and may therefore embody the storage means and user interface means utilized by the present invention When the test equipment user saves the context data, s/he uses software, such as a text editor, to enter the background information corresponding to the test data and setup data. At this time, the test equipment user also saves the test setup data. Upon recall or printout of the recorded test data or setup data, the stored, associated background information are also retrieved. To help assure that the user updates the context data, any changes saved in the associated setup or test data automatically prompt the user to enter corresponding changes in the context data. This helps assure that the context data is maintained in a current state as the associated test data and setup data are modified.

In an alternative embodiment of the present invention, the context data may be gathered by voice input rather than as textual input from a keyboard or pointing device on the computer or test equipment. This enhances the ease with which the user may enter and update the context data and avoids confusion arising from illegible notes hand written in accord with prior manual techniques. The voice information may be simply recorded and stored for later recall and playback or may be interpreted by voice recognition functions to automate the recordation of textual information corresponding to the user's spoken information.

This invention eliminates the difficulties of saving important background information and thereby provides a system for accurately and effectively recording and associating related test data, test setup, and background information. The stored background information is useful for future reference to duplicate exact test conditions, form a baseline for test data, use for design reviews, or use for device failure reviews. Furthermore, the present invention allows easy access to the recorded data for graphical use and data reduction purposes.

Additional advantages of the invention will be set forth in part in the description which follows, and in part will be obvious from the description, or may be learned by practice of the invention. The advantages of the invention may be realized and attained by means of instrumentalities and combinations particularly pointed out in the appended claims.

DESCRIPTION OF THE PREFERRED EMBODIMENT

Figure 1:
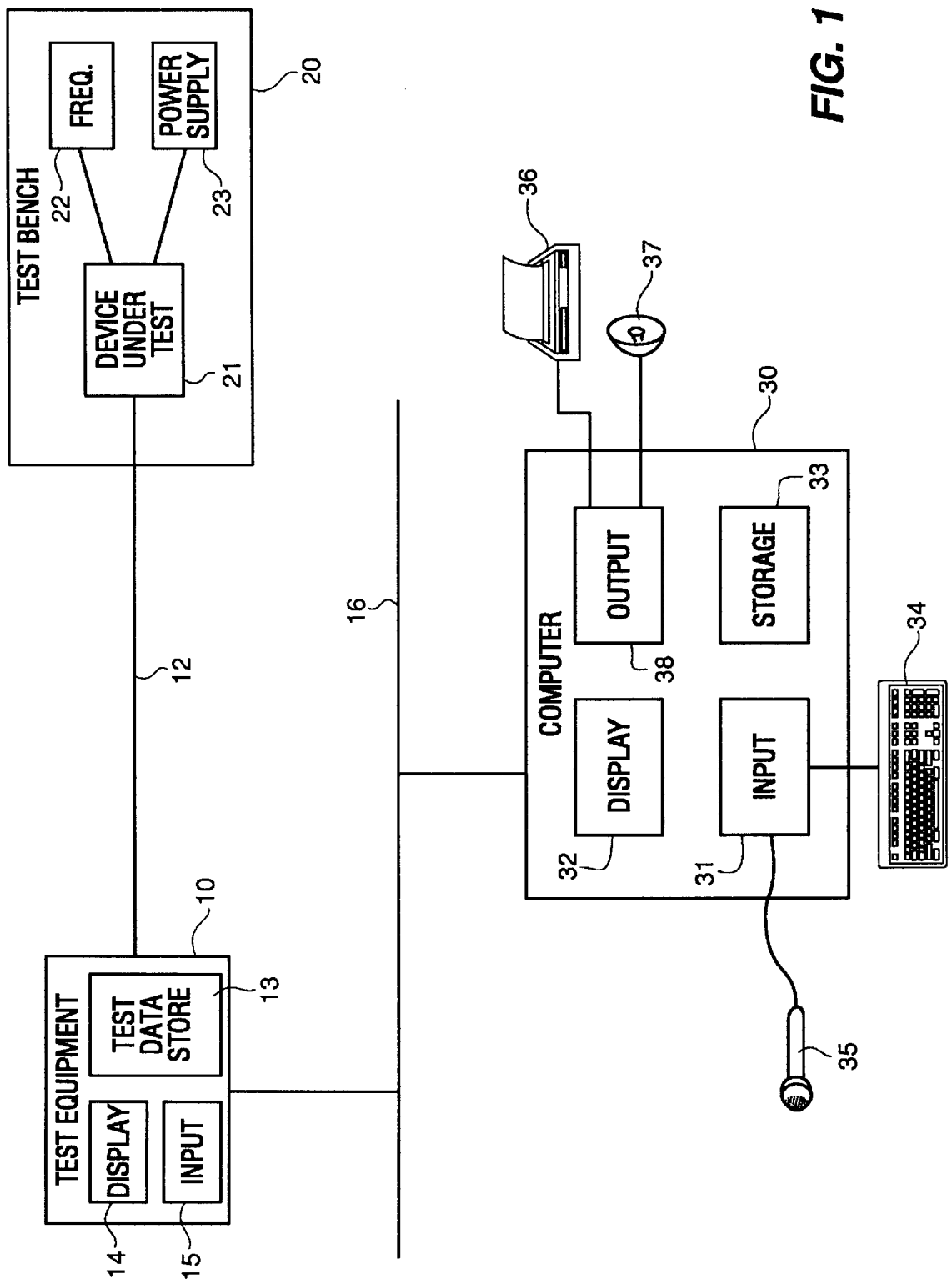
FIG. 1 is a block diagram of a first embodiment of the present invention in which a general purpose computer system having a storage means is utilized to store and associate test data, test setup, and context information entered by a user.

While the invention is susceptible to various modifications and alternative forms, a specific embodiment thereof has been shown by way of example in the drawings and will herein be described in detail. It should be understood, however, that it is not intended to limit the invention to the particular form disclosed, but on the contrary, the invention is to cover all modifications, equivalents, and alternatives falling within the spirit and scope of the invention as defined by the appended claims.

TEST ENVIRONMENT CONTEXT DATA

Test equipment 10 of FIG. 1 is used to acquire test data via path 12 from a device under test 21 within test bench 20. One of ordinary skill in the art will note that the test equipment 10 can represent any of several standard test devices used for measuring data such as: oscilloscopes, logic analyzers, ohm meters, volt meters, etc. Test equipment 10 includes storage means 13 to store acquired test data. One skilled in the art will note that storage means 13 can be a semiconductor memory device (e.g., RAM, PROM, or flash memory devices), a floppy disk drive, a hard disk drive, etc. Test equipment 10 also includes a display means 14 (such as a CRT or LCD screen) for displaying acquired test data and an input means 15 (such as a keypad) for inputting data to configure and operate the test equipment.

Test bench 20 includes the device under test 21 and any other devices needed as test stimuli sources such as, for example, a frequency generator 22 and a power supply 23. Computer 30 includes display means 32 (such as a computer display screen), data input means 31, data output means 38, and storage means 33. Data input means may include, for example, a keyboard 34 for textual input and a microphone 35 (and appropriate sound processing circuits) for acquisition and recordation of audio information. Data output means 38 may include, for example, a printer 36 for textual data presentation and a speaker 37 (and appropriate sound processing circuits) for presentation of audible data (e.g., playback of previously recorded audio data). One skilled in the art will recognize that test equipment 10, test bench 20, and computer 30 are representative of a wide range of devices selected as required for a particular testing application environment wherein the methods and structure of the present invention may be advantageously applied.

In the embodiment of FIG. 1 test equipment 10 is electronically interfaced with the test bench 20 by path 12. Specifically, path 12 may represent probe leads as required by the test equipment 10 attached to appropriate test points on the device under test 21 or other relevant test points in the test bench (e.g., points associated with, for example, frequency generator 22 or power supply 23). Test equipment 10 acquires measurements from the test points. Such measurements are referred to herein as test data (also as acquired test data). This test data is stored in the test equipment's storage means 13 and/or presented to the user on display means 14 of test equipment 10.

Test equipment 10 is connected to computer 30 via path 16. Path 16 represents any of several well known interconnection methods and apparatus commonly applied to the connection of computing devices to test instruments. For example, path 16 may be an IEEE-488 bus, a SCSI bus, a local area network (LAN), or other well known electronic interconnection structures. Computer 30 may control the operation of test equipment 10 via the exchange of signals over path 16. In addition, computer 30 and test equipment 10 may exchange data via path 16 including, for example, test data acquired by test equipment 10 and setup data describing the configuration of test equipment 10.

When a user at computer 30 requests the storage of test data and/or setup data from test equipment 10, computer 30 opens a window on its display 32 prompting the user to enter context data via input means 31. The user then enters textual context data describing relevant parameters associated with the test environment. The entered context data along with the test data and/or test setup retrieved from test equipment 10 is then stored in storage means 33 of computer 30.

In accord with the methods of the present invention, computer 30 stores the context data in such a manner as to be associated with the test data and/or setup data. For example, the context data, test data, and setup data may be stored in a single, common file or location within storage means 33 (e.g., within a single file on a disk file system of storage means 33). Alternatively, the context data, test data and setup data may be stored in distinct files but associated by a common file naming convention established and maintained by computer 30 operable in accord with the present invention. One skilled in the art will recognize many equivalent techniques and structures which may be employed to associate context data, test setup, and test data. Standard table lookup techniques as well as more complex database management techniques may be employed for example. In addition, one skilled in the art will recognize that the association may be one-to-one, many-to-many, etc. For example, a single context data "file" may be associated with one or more test setup "files" and one or more test data "files", etc. More generally, the various sets of data are also referred to herein as data sets.

Key to the present invention is the association drawn between the context data set (entered by the user and stored by computer 30 in storage means 33) and the test data and setup data sets retrieved from test equipment 10 by computer 30 via path 16. By associating these data sets, the methods and structure of the present invention help improve the accuracy of the context data. This feature helps, as noted above, to improve the repeatability of test conditions which led to a specific test data acquisition and to establish baseline test environment parameters, etc.

The context data provided by the user via input means 31 may comprise textual data entered via keyboard 34. The window opened by computer 30 in response to can open up to a blank page for use with a standard text editor as is known in the art. Alternatively, the window may present a standard form into which the user enters commentary comprising the context data according to a pre-defined format. Using the editor, the test equipment user records test setup data from the test equipment and records background information regarding the test bench and test equipment.

In the alternative or in addition to textual context data, the context data provided by the user may comprise spoken words recorded (digitally or otherwise) for later playback. Input means 31 therefore may include microphone 35 into which the user may speak to supply the context data for he test environment. One skilled in the art will further recognize that the spoken context data, if suitably processed, may be transformed into textual data for later retrieval and modification as standard textual data.

As noted, output means 38 may include a printer for output of textual data. Textual context data as well as associated test data and/or test setup may be presented to the user on display means 32 or on printer 36 through output means 38. In addition, output means 38 may include speaker 37 for presentation of audio information to the user (in conjunction with appropriate sound processing circuits). Audio context data (user voice recordings) previously entered may be replayed (presented) to the user through output means 38 and speaker 37. Further, one skilled in the art will recognize that any textual data (e.g., textual context data) may be converted to audio signals through commercially available speech generation techniques and presented to the user through speaker 37 via output means 38.

One skilled in the art may note that some test equipment may be incapable of exchanging test setup information over path 16 with a controlling computer. In particular, older test devices tend to utilize a simple user interface provided by a limited function keypad and a relatively small display. Further, older test devices may be incapable of storing a plurality of previously utilized test setups. At a minimum, such older devices typically possess an ability to output any captured test data (perhaps in a compact binary format or at least in a format intended for hard-copy (printed) output. The methods of the present invention are operable in conjunction with such a device in that the user may enter the test setup as part of the context data provided by the user. In other words, the user may describe the test setup data as part of the context data. The test data may then be retrieved by computer 30 from test equipment 10 by receiving the test data as output by the test equipment 10 intended for hard copy (printed) output. This captured test data may then be stored in association with the context data in accord with the present invention.

A user may recall any of several previously saved test environments by reference to the any portions of the associated data stored in the storage means 33. For example, when viewing a test data file for test results contained therein, the associated test setup and context data may be easily located for display or output (e.g., printing) by computer 30 based upon the association established by the methods and structure of the present invention. In like manner, a test setup may be retrieved and transferred to the test equipment 10 by computer 30 via path 16 to repeat a prior test sequence. The associated context data file may also be retrieved and presented to the user to prompt the user to establish other test environment parameters of the prior test sequence as required.

The present invention thereby reduces the difficulties of recording important background information (context data) thus, in turn, providing a system for accurately and effectively recording associated test data, test setup, and context data. The system is flexible in that virtually any context data may be entered by the user and associated with the test setup and test data. The data entry may be free form (e.g., unconstrained text or voice recordings) or formatted (e.g., a standard data entry screen for text data or prompts for particular voice responses). The recorded information is saved for future reference to duplicate exact test conditions, form a baseline for test data, used for design reviews, or used for device failure reviews.

Figure 2:
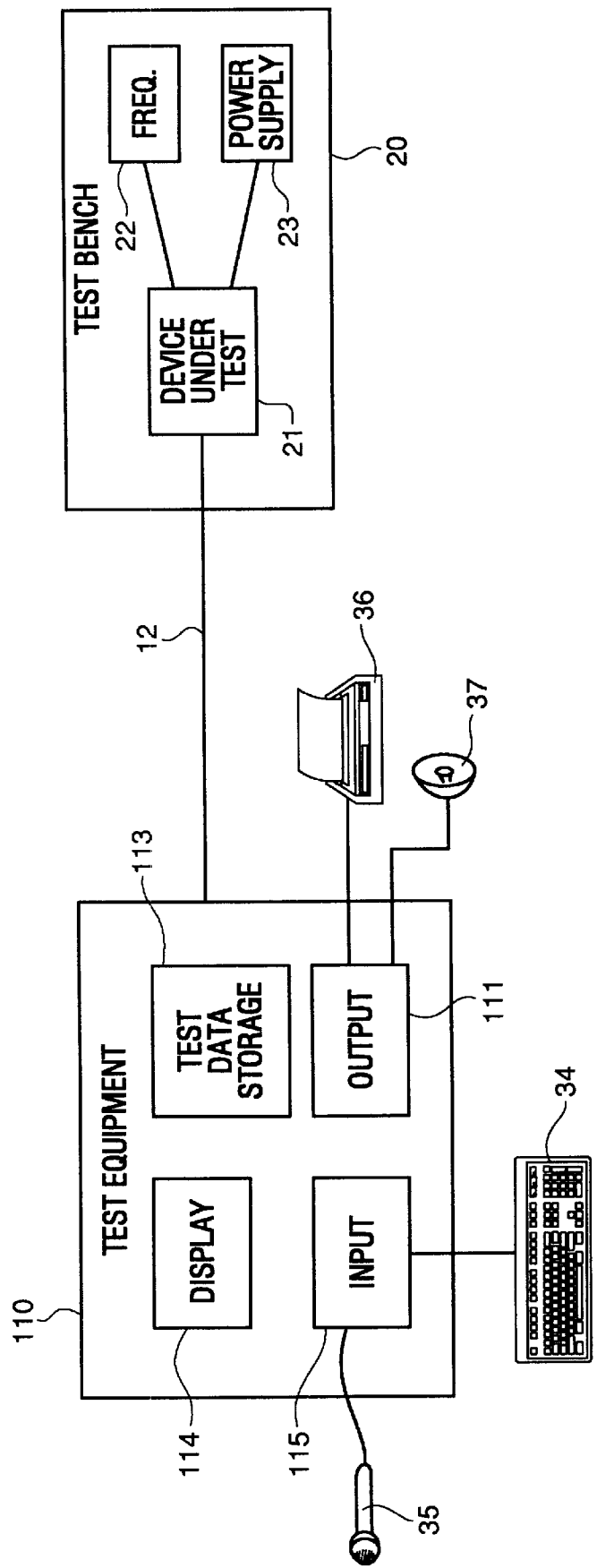
FIG. 2 is a block diagram of a second embodiment of the present invention wherein the storage means and user input means within the test equipment are utilized to gather and maintain context data.

FIG. 2 is a block diagram depicting an alternative embodiment of the present invention. Modern test equipment has evolved in many cases to incorporate sophisticated general purpose computational power with the test equipment itself. Often the user interface of modern test equipment offers similar richness to that offered by windowed interfaces in a general purpose computer. In addition, many modern test devices integrate substantial mass storage devices (e.g., disk drives) for purposes of storing test setup and acquired test data. The display and analysis of captured test data is often therefore performed using the local processing functions of the test equipment. The advanced user interface and local mass storage of such advanced test devices allow the test equipment to perform the functions noted above.

FIG. 2 therefore depicts test equipment 110 which incorporates many of the features shown within computer 30 of FIG. 1. Specifically, test equipment 110 includes display means 114 with enhanced graphics capability as compared to test equipment 10 for presentation of, for example, a windowed user interface or graphics displays. Input means 115 within test equipment 110 includes an interface for a full function keyboard 34 (as compared to a limited function keypad as in input means 15 of FIG. 1) and a microphone 35 along with appropriate sound processing circuits for acquisition of the user's voice for context data. Output means 111 within test equipment 110 of FIG. 2 includes a printer 36 and a speaker 37 for use as noted above to present associated test data, test setup, or context data. Storage means 113 of test equipment 110 is enhanced as compared to storage means 13 of FIG. 1 to permit storage of test data as well as associated test setup and context data.

In the embodiment represented by FIG. 2 the operations for associating the various related data and storing the associated data is performed within test equipment 110 rather than in an external computer (30 as in FIG. 1). Test data is acquired from the test bench 20 as above in FIG. 1 via path 12. Test setup from test equipment 110 and context data acquired by test equipment 110 via input means 115 are then associated with the test data and stored in storage means 113 within test equipment 110.

ASSOCIATING DATA

A variety of equivalent methods may be employed in accord with the present invention to associate the stored data. A first method applicable where the associated data is stored in a file system in storage means 33 in computer 30 of FIG. 1 or storage means 113 in test equipment 110 of FIG. 2. A name is associated with each file of the associated data in the file system. The file names may be used to reflect the association of a context data file with a test setup file and a test data file. For example, an MS-DOS file name might utilize the file type (extension) to indicate that the file contains context data or test setup or test data. The remainder of the file name could represent a particular test sequence environment. The test sequence could be identified by any unique identifier usable as a DOS file name. When one of the associated files is selected for presentation by the user, the associated files may be easily identified by the test sequence identifier used as portion of their respective file names.

Figure 3:
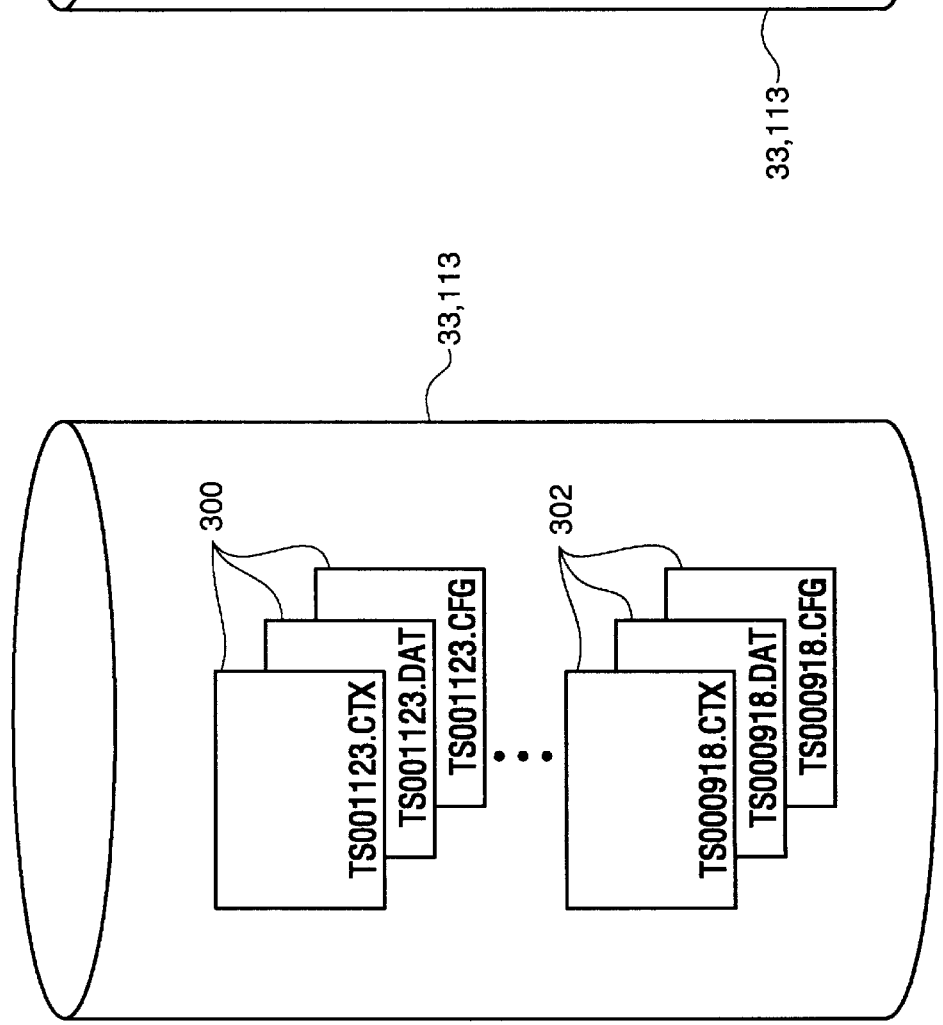
FIG. 3 is a block diagram of a storage means of either FIG. 1 or FIG. 2 in which data sets are stored as files in a file system structure such as on a disk drive.

FIG. 3 is a block diagram showing storage means 33 (of FIG. 1) or storage means 113 (of FIG. 2) as a file system (e.g., disk subsystem) wherein a plurality of files 300 and 302 are stored. Each file is identified by a file name. File name conventions and syntax may vary in accord with the requirements of the system in which the files services are provided. For example, in accord with the MS-DOS operating system, a file name includes 8 characters selected by a user followed by a "." character, followed by three additional characters intended to suggest the type of the file (also referred to as a file extension). Other files systems allow significantly more flexibility and complexity in their respective file naming conventions.

As shown in FIG. 3, three files 300 are associated by use of a common 8 character portion of the file name (e.g., "TS001123"). A first of the files is a context data file having a file extension of "CTX" while a second is a test data file having a file extension of "DAT" and the last is a test setup file having an extension of "CFG." The three files are associated as corresponding to a particular test environment (e.g., a test sequence) by sharing the common file name portion (common portion) of "TS001123." A second test environment is represented by three files 302 sharing a file name portion of "TS000918." A unique portion of each file name (e.g., the DOS file extension) is used to uniquely identify the type of the files associated by the common portion of their respective file names.

The exemplary association of related files shown in FIG. 3 and discussed above provides a one-to-one mapping of associated files to one another. In other words a particular context file is associated (by the common root of their file names) to exactly one test data file and exactly one test setup file. By selecting any one of the three associated files 300 or any one of the three associated files 302, the other associated file types may be readily located by using the same file name with the proper extension for the file type to be located.

Figure 4:
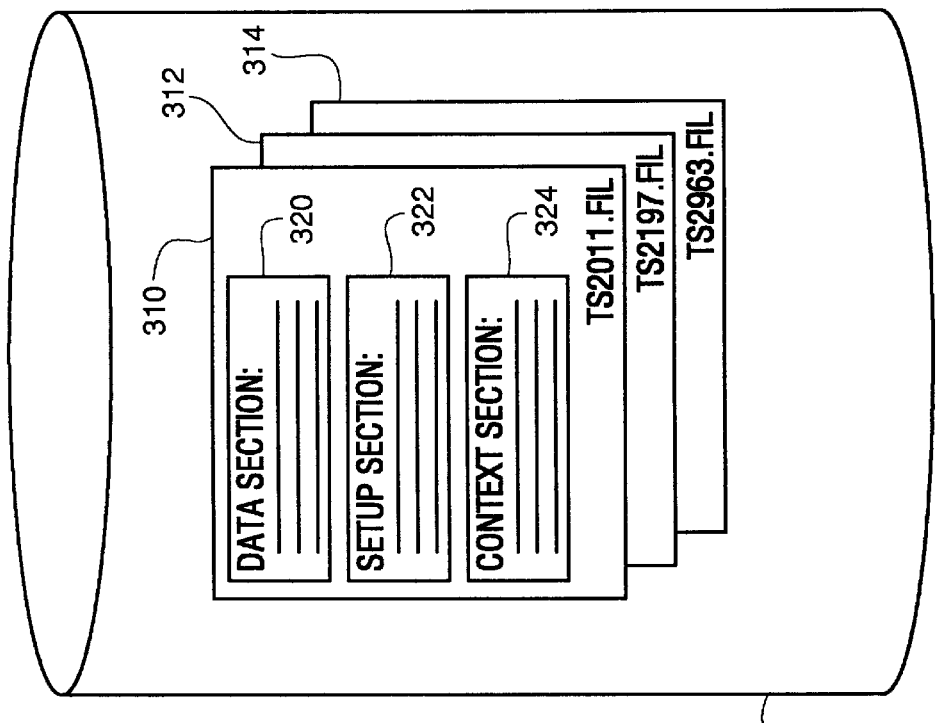
FIG. 4 is a block diagram of a storage means of either FIG. 1 or FIG. 2 in which data sets are stored as sections of a single structured file on a disk file system.

FIG. 4 is a block diagram showing storage means 33 (of FIG. 1) or storage means 113 (of FIG. 2) as a file system (e.g., disk subsystem) wherein a plurality of files 310–314 are stored. Each file 310–314 is identified by a file name (e.g., TS2011.FIL, TS2197.FIL, and TS2963.FIL, respectively). In accord with the MS-DOS operating system, a file name includes 8 characters selected by a user followed by a "." character, followed by three additional characters intended to suggest the type of the file (also referred to as a file extension).

As shown in FIG. 4, a particular test is stored as a single structured file on a disk files system. Each single file is structured in such a manner as to have a plurality of sections (320–324), one for each of the associated data sets. A first section 320 in the structured file corresponds to the acquired test data for the particular test. A second section 322 corresponds to the test setup data set associated with the acquired test data. A third section 324 corresponds to the user entered context data associated with the particular test. The name of the structured file is supplied by the user and identifies the particular test.

The exemplary association of data sets by sections within a single file shown in FIG. 4 and discussed above also provides a one-to-one mapping of associated data sets to one another. In other words a particular test sequence associates all the data sets of the test sequence as sections in the single test sequence structured file. By selecting any one of the three associated sections 320–324, the other associated sections may be readily located within the same structured file.

One skilled in the art will recognize that a variety of conventions and standards may be applied to use of the file names to represent the association among a plurality of files including the stored context data. In addition, one skilled in the art will recognize that many other file naming standards are applicable based upon the requirements of the underlying file system services. Other operating system environments may adhere to different file naming standards involving longer or shorter names, including or excluding certain character sequences, etc. All such file systems may be utilized by the present invention for storage of the various files and storage of the association information.

In a second embodiment, the association of the various data may be achieved by a table built and maintained by the methods of the present invention. When a context data file, test setup file, or test data file is created, an entry for the file may be created in a first lookup table. The entries of this first lookup table translate an identifier provided by the user for the file with a location at which the file may be found in the storage means (e.g., physical storage location or file name for example). Essentially this first table functions as a directory to locate each of the stored data sets (context, setup and acquisition data). If the storage means does not utilize a standard file system, this first lookup table may serve a similar purpose.

For example, if the storage means is a simple linear memory array embedded within the test equipment (e.g., storage means 113 of test equipment 110), the overhead processing required to maintain a fully functional file system may be unnecessary. A simpler lookup table as described here may provide similar functionality with lower complexity.

Another table may then be created and maintained by the methods of the present invention having an entry for each association required among the plurality of files. Each entry in this second table includes a reference to one context data entry in the first table, one test setup entry in the first table, and one test data entry in the first table. This entry serves to associate a test identification (supplied by the user) with a tuple of three data sets which correspond to a particular test environment (a particular test sequence). When the user selects one of the data sets for presentation or analysis, other associated data sets may be identified by inspection of the second lookup table.

Those skilled in the art will recognize that the second embodiment for association of the data provides the ability to associate one data set with any number of other types of dat sets. For example, one test setup data set may be associated with several context data sets and test data sets. Each such association corresponds to an entry in the second lookup table.

Figure 5:
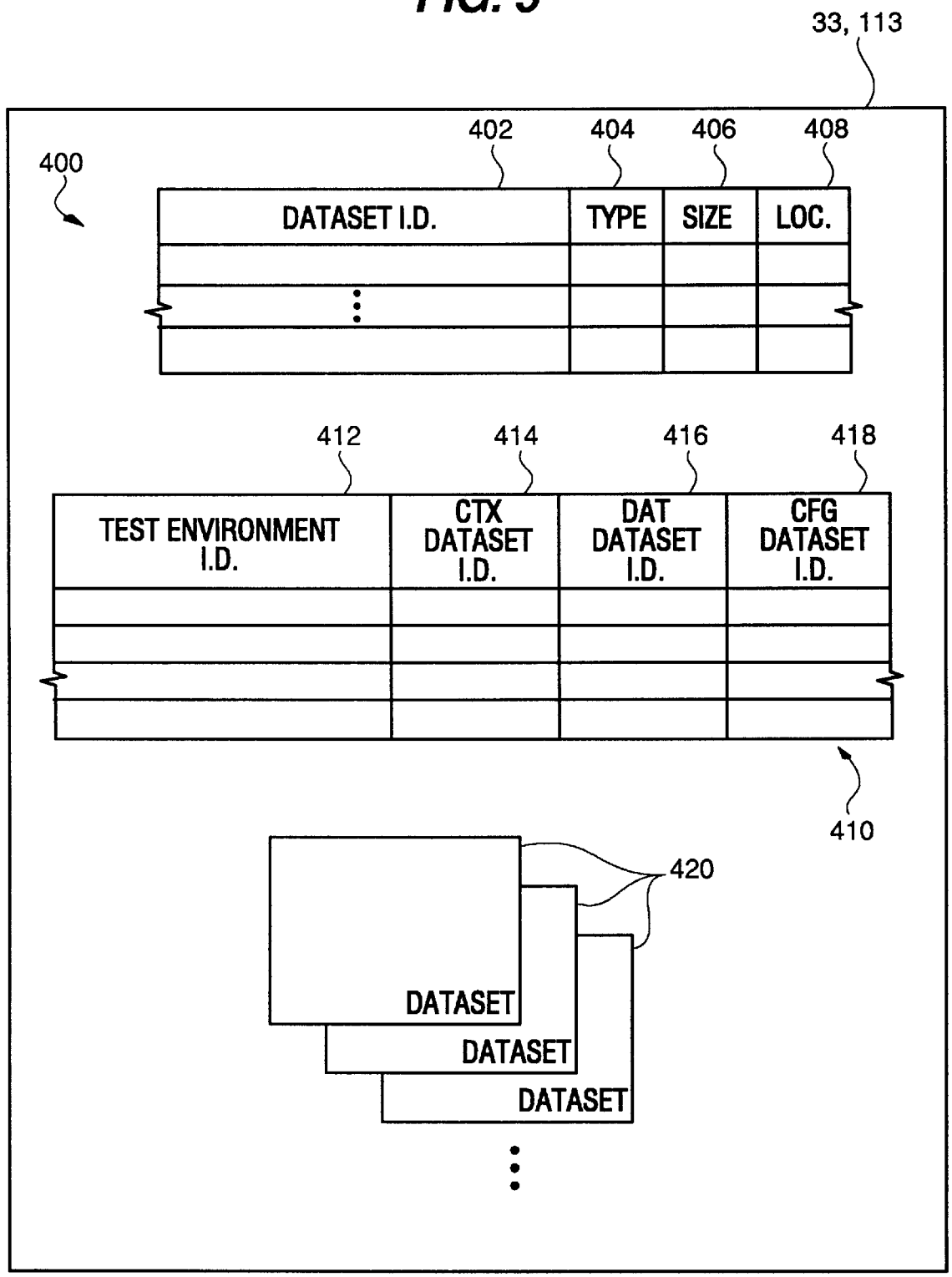
FIG. 5 is a block diagram of a storage means of either FIG. 1 or FIG. 2 wherein data sets are stored, associated, and located with reference to lookup tables.

FIG. 5 is a block diagram depicting such table structures maintained within storage means 33 of FIG. 1 or storage means 113 of FIG. 2. As presented in FIG. 5, storage means 33 or 113 may be any randomly accessible storage device having a linear address space for locating data therein. A first table 400 is used to associate an identifier with a particular data set. Columns of the first table 402 include: a data set ID field 402 in which a user selected identifier is associated with a data set, a data set type field 404 indicative of the data set's type as one of context data, test data, or test setup, a size field 406 indicating the total size of the data sets as stored in the storage means, and a location field 408 identifying the location in the storage means where the data set may be found.

A second table 410 is used to associate a test environment identification with a tuple of three data sets: one context data set, one test data set, and one test setup data set. Entries of the second table establish the association of the three data sets with a particular test environment or test sequence. Each entry of the second table 410 includes columns as follows: a test environment ID field 412 in which a user supplied test sequence/environment ID is entered, a CTX data set ID field 414 containing the data set ID of the context data set associated with the test sequence, a DAT data set ID field 416 containing the data set ID of the test data set associated with the test sequence, and a CFG data set ID field 418 containing the data set ID of the test setup data set associated with the test sequence, In response to the user identifying a single test environment by the test environment ID value, methods of the present invention may locate any of the three data sets associated with that particular test sequence. For example, a user supplied test environment ID value is first used to locate an entry in the second table 410. The CTX data set ID field 414 value in the located test environment entry of the second table 410 may be used to lookup the size and location of the context data set in the first table 400. In like manner, the located entry in the second table may be used to locate the test data set and the test setup data set.

Those skilled in the art will recognize that the lookup table structures depicted in FIG. 5 may be implemented using a variety of data structures and associated methods. Customized data structures as depicted may be utilized as well as commercially available data management systems (e.g., database systems). The specific design choice will depend upon other parameters of the environment in which the methods of the present invention are applied.

ASSOCIATION METHODS

Figure 6:
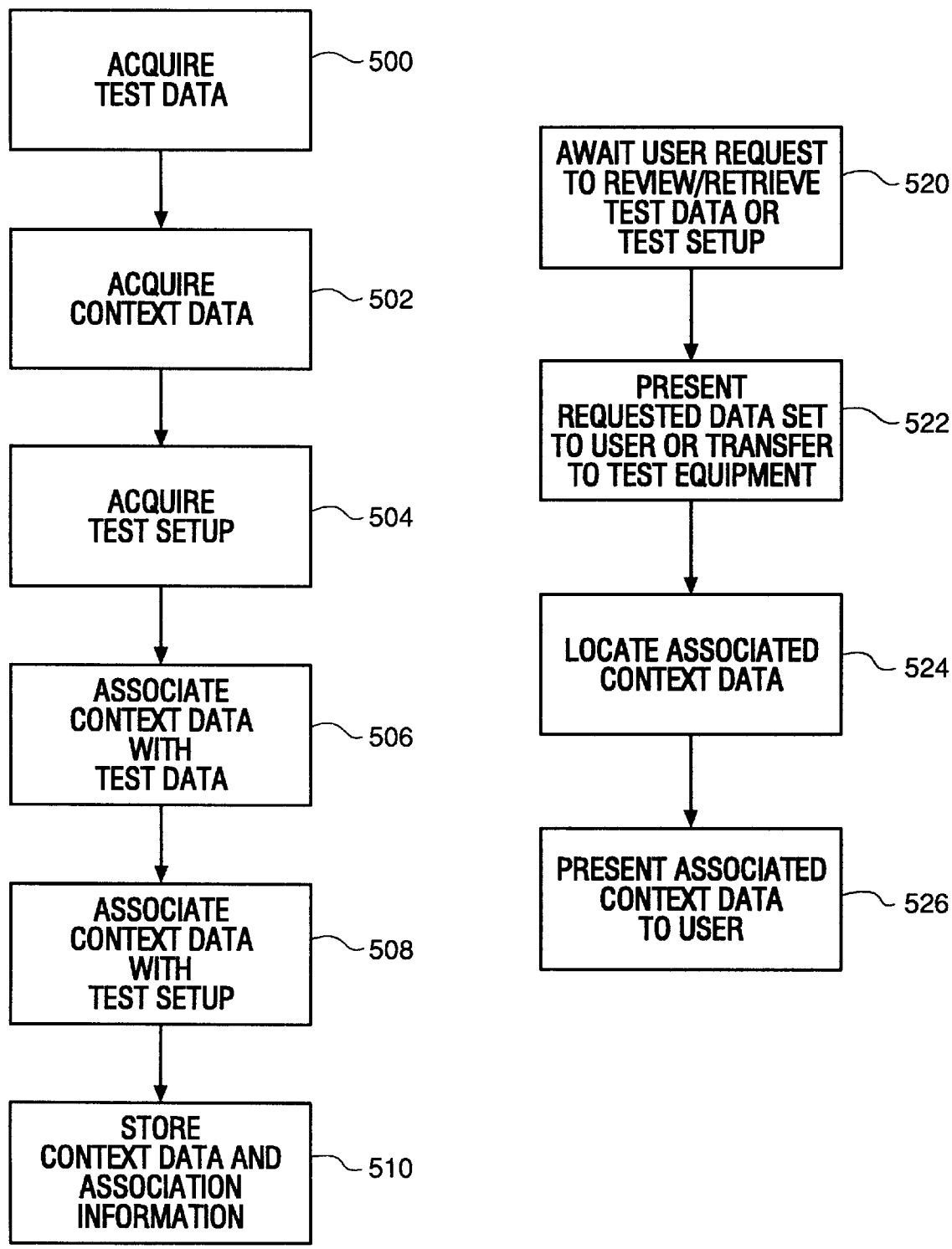
FIG. 6 is a flowchart describing the methods of the present invention for retrieving and storing associated data in the storage means.

FIG. 6 provides two flowcharts describing the methods of the present invention to create, store and apply the association information used to associate the stored context data with the test data and test setup. Elements 500–510 describe the method of creating and storing the association information as well as storing the acquired context data. Elements 500–504 are first operable to acquire the test data, context data, and test setup. As noted above, acquisition of the test data and test setup is dependent upon the specific test equipment. If the methods of the present invention are operable within the test equipment (as in FIG. 2), elements 500 and 504 are standard operations within the test equipment. If the methods of the present invention are operable within a general purpose computer attached to the test equipment (as in FIG. 1), acquisition of the test data and test setup is via an interconnecting communication medium.

Context data is acquired by operation of element 502. Where the context data includes exclusively textual information (also referred to herein as textual context data), the input means of the test equipment or general purpose computer prompt the user to enter the context data via a keyboard or other text input device (for example, either in a blank text editing window or in a predefined form). Where the context includes sound information (e.g., user voice information also referred to herein as voice context data or audio context data), the input means of the test equipment or general purpose computer prompt the user to enter the context data through a microphone (via appropriate sound processing circuits). The captured voice information may be stored as such for later playback presentation to the user or may be translated into textual form by well known voice processing techniques for later textual presentation to the user.

Elements 506 and 506 are then operable to associate the acquired context data with the acquired test data and with the acquired test setup, respectively. Element 510 then stores the acquired context data as well the association information created by elements 506 and 508. As noted above, the association information may be embodied in a variety of forms including: file naming conventions, structured files, and lookup table structures. Element 510 therefore represents the processing required to generate or store all information required for associating the context data with test data and test setup data of the same test sequence or environment.

Elements 520–526 describe the operation of the methods of the present invention to utilize the stored association information to present the stored context data. Element 520 is first operable to await a user request to review or retrieve a particular test environment's test data or test setup. Element 522 is then operable to process the requested data set. Where a test data set is requested by the user, the test data is presented to the user (e.g., displayed or printed for the user's review). Where a test setup data set is requested, the test setup data set is transferred to the test equipment to restore the test equipment to the previously saved configuration.

Element 524 is then operable to locate the context data set associated with the retrieved test data set or test setup data set. The located context data is then presented to the user by operation of element 526. As noted, presentation of textual context data may be by display or printer output whereas presentation of recorded voice context data may be by way of sound playback or translation to text and appropriate display or printing.

While the invention has been illustrated and described in detail in the drawings and foregoing description, such illustration and description is to be considered as exemplary and not restrictive in character, it being understood that only the preferred embodiment and minor variants thereof have been shown and described and that all changes and modifications that come within the spirit of the invention are desired to be protected.

What is claimed is:

1. In a system including test equipment connected to a test bench having a device under test, a method for integrated storage of user supplied context data, said method comprising the steps of:

acquiring said context data wherein said context data includes environmental data external to said device under test;

storing said context data in a memory associated with said system wherein said memory is external to said device under test;

associating said context data with test data acquired from said test bench by said test equipment; and associating said context data with test setup data relating to said test equipment.

2. The method of claim 1 wherein said system includes a computer and wherein said memory is associated with said computer:

wherein the step of associating said context data with test data includes the steps of:
  transferring said test data from said test equipment to said computer; and
  storing said test data in said memory of said computer.

3. The method of claim 2:
wherein the step of associating said context data with test setup data includes the steps of:
  transferring said test setup data from said test equipment to said computer; and
  storing said test setup data in said memory of said computer.

4. The method of claim 1 wherein said memory is within said test equipment and wherein the method further comprises the steps of:
  storing said test data in said memory; and
  storing said test setup data in said memory.

5. The method of claim 1 wherein the step of acquiring context data further comprises the step of acquiring textual context data.

6. The method of claim 1 wherein the step of acquiring context data further comprises the step of acquiring audio context data.

7. The method of claim 1
wherein the step of associating said context data with said test data includes the step of:
  storing said test data in a disk file identified by first file name, wherein said first file name includes a common portion and a unique portion, and
wherein the step of storing said context data includes the step of:
  storing said context data in disk file identified by a second file name, wherein said second file name includes a common portion substantially identical to said common portion of said first file name and a unique portion.

8. The method of claim 1
wherein the step of associating said context data with said test setup data includes the step of:
  storing said test setup data in a disk file identified by first file name, wherein said first file name includes a common portion and a unique portion, and
wherein the step of storing said context data includes the step of:
  storing said context data in disk file identified by a second file name, wherein said second file name includes a common portion substantially identical to said common portion of said first file name and a unique portion.

9. The method of claim 1
wherein the step of associating said context data with said test data includes the step of:
  storing said test data in a disk file identified by first file name, wherein said first file name includes a common portion and a unique portion,
wherein the step of associating said context data with said test setup data includes the step of:
  storing said test setup data in a disk file identified by second file name, wherein said second file name includes a common portion substantially identical to said common portion of said first file name and a unique portion, and
wherein the step of storing said context data includes the step of:
  storing said context data in disk file identified by a third file name, wherein said third file name includes a common portion substantially identical to said common portion of said first file name and a unique portion.

10. The method of claim 1
wherein the step of associating said context data with said test data includes the step of:
  storing said test data in a first section of a disk file, and
wherein the step of storing said context data includes the step of:
  storing said context data in a second section of said disk file.

11. The method of claim 1
wherein the step of associating said context data with said test setup data includes the step of:
  storing said test setup data in a first section of a disk file, and
wherein the step of storing said context data includes the step of:
  storing said context data in a second section of said disk file.

12. The method of claim 1
wherein the step of associating said context data with said test data includes the step of:
  storing said test data in a first section of a disk file,
wherein the step of associating said context data with said test setup data includes the step of:
  storing said test setup data in a second section of said disk file, and
wherein the step of storing said context data includes the step of:
  storing said context data in third section of said disk file.

13. The method of claim 1
wherein the step of associating said context data with said test data includes the step of:
  generating an entry in a lookup table associating said test data with an identified test environment, and
wherein the step of storing said context data includes the step of:
  adding information to said entry associating said context data with said test environment.

14. The method of claim 1
wherein the step of associating said context data with said test setup data includes the step of:
  generating an entry in a lookup table associating said test setup data with an identified test environment, and
wherein the step of storing said context data includes the step of:
  adding information to said entry associating said context data with said test environment.

15. The method of claim 1
wherein the step of associating said context data with said test data includes the step of:
  generating an entry in a lookup table associating said test data with an identified test environment,
wherein the step of associating said context data with said test setup data includes the step of:
  adding information to said entry associating said test setup data with said test environment, and
wherein the step of storing said context data includes the step of:
  adding information to said entry associating said context data with said test environment.

16. In a system including test equipment connected to a test bench having a device under test, an apparatus within said test equipment for integrated storage of user supplied context data, said apparatus comprising:

an input device operable to acquire context data wherein said context data includes environmental data external to said device under test;

a memory device external to said device under test;

a processor connected to said memory device and to said input device; and wherein said processor is adapted to receive said context data from said input device, and wherein said processor is adapted to store said context data in said memory device, and wherein said processor is adapted to receive test data from said device under test, and wherein said processor is adapted to store said test data in a manner associated with said context data, and wherein said processor is adapted to store test setup data associated with said test equipment in a manner associated with said context data.

17. The apparatus of claim 16 wherein said input device includes a keyboard for acquiring textual context data.

18. The apparatus of claim 16 wherein said input device includes an audio acquisition device.

19. In a system including test equipment connected to a test bench having a device under test, an apparatus for integrated storage of user supplied context data, said apparatus comprising in combination:

a computer, wherein said computer includes:
an input device operable to acquire context data, and
a memory device;

a signal path connecting said test equipment to said computer, wherein test data associated with said device under test is communicated from said test equipment to said computer via said signal path and wherein test setup data associated with said test equipment is communicated from said test equipment to said computer via said signal path;

wherein said computer is adapted to receive said context data from said input device, and wherein said computer is further adapted to store said context data in said memory device, and wherein said computer is further adapted to receive said test data from said test equipment, and wherein said computer is further adapted to store said test data in a manner associated with said context data, and wherein said computer is adapted to receive said test setup data from said test equipment, and wherein said computer is adapted to store said test setup data in a manner associated with said context data.

20. The apparatus of claim 19 wherein said input device includes a keyboard for acquiring textual context data.

21. The apparatus of claim 19 wherein said input device includes an audio acquisition device.

* * * * *